United States Patent
Bronner et al.

(10) Patent No.: US 6,538,295 B1
(45) Date of Patent: Mar. 25, 2003

(54) SALICIDE DEVICE WITH BORDERLESS CONTACT

(75) Inventors: Gary B. Bronner, Stormville, NY (US); Jeffrey P. Gambino, Gaylordsville, CT (US); Louis L. Hsu, Fishkill, NY (US); Jack A. Mandelman, Stormville, NY (US); Carl J. Radens, La Grangeville, NY (US); William R. Tonti, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/645,499

(22) Filed: Aug. 25, 2000

Related U.S. Application Data

(62) Division of application No. 09/260,311, filed on Mar. 2, 1999, now Pat. No. 6,174,762.

(51) Int. Cl.[7] .......... H01L 29/76; H01L 29/94; H01L 31/062; H01L 31/113
(52) U.S. Cl. .......... 257/412; 257/384; 257/388; 257/413
(58) Field of Search ............... 257/412, 344, 257/382, 383, 384, 408, 413, 388; 438/592, 596, 584, 595, 655–657, 682, 683

(56) References Cited

U.S. PATENT DOCUMENTS

| | | | |
|---|---|---|---|
| 4,593,454 A | 6/1986 | Baudrant et al. | |
| 4,716,131 A | 12/1987 | Okazawa et al. | |
| 4,868,617 A | * 9/1989 | Chiao et al. | 257/344 |
| 4,876,213 A | 10/1989 | Pfiester | |
| 4,877,755 A | 10/1989 | Rodder | |
| 5,268,330 A | 12/1993 | Givens et al. | |
| 5,508,212 A | 4/1996 | Wang et al. | |
| 5,512,502 A | 4/1996 | Ootsuka et al. | |
| 5,683,941 A | 11/1997 | Kao et al. | |
| 5,691,212 A | 11/1997 | Tsai et al. | |
| 5,736,455 A | 4/1998 | Iyer et al. | |
| 5,783,479 A | 7/1998 | Lin et al. | |
| 6,218,276 B1 | * 4/2001 | Liu et al. | 438/596 |

OTHER PUBLICATIONS

TW306061A (Abstract Only).
TW295720A (Abstract Only).
TW304279A (Abstract Only).
IBM TDB; 9/87; pps 1645–1646 (Abstract Only).
IBM TDB; 1/84; p. 4338 (Abstract Only).
IBM TDB; 8/84; pp. 1801–1802 (Abstract Only).

* cited by examiner

Primary Examiner—Olik Chaudhuri
Assistant Examiner—Theresa T. Doan
(74) Attorney, Agent, or Firm—Todd M. C. Li; McGinn & Gibb, PLLC

(57) ABSTRACT

A method and structure for a field effect transistor structure for dynamic random access memory integrated circuit devices has a gate conductor, salicide regions positioned along sides of the gate conductor, a gate cap positioned above the gate conductor and at least one self-aligned contact adjacent the gate conductor.

20 Claims, 5 Drawing Sheets

SALICIDE DEVICE WITH BORDERLESS CONTACT

This application is a divisional of Ser. No. 09/260,311 filed on Mar. 2, 1999 now U.S. Pat. No. 6,174,762.

BACKGROUND OF THE INVENTION

1. Field of the Invention

This invention relates to the formation of integrated circuits which include gate conductor and diffusion regions which have self-aligned silicide (salicide) conductive materials and contacts to diffusion regions which are self-aligned (borderless) to the gate conductor regions.

2. Description of the Related Art

As the size of integrated circuits devices (such as semiconductor devices) decreases below the one-half or one-quarter micron range, conventional photolithographic techniques may not meet required tolerances. In response to this problem, a number of self-aligned methods (which do not rely upon masks or similar photolithographic techniques) have been developed to increase the density of integrated circuit devices.

One such self-aligned technique involves the formation of self-aligned silicides known as salicides. Silicides are formed from the thermal combination of silicon and a metal such as titanium, cobalt or tungsten. Silicides are used to reduce contact resistance and to reduce the resistance of localized regions of silicon.

Conventional salicide forming techniques place an insulator (e.g., oxide or nitride) between the metal and the silicon in areas where the silicide is not to be formed. Therefore, only in areas where the silicon directly contacts the silicon. The silicide will be formed. In this way, the silicide is self-aligned (e.g. is a salicide) and does not require conventional photolithographic techniques.

Another example of a self-aligned device which is used with field effect transistors in, for example, dynamic random access memory (DRAM) devices and which helps increase circuit density is a borderless (e.g., self-aligned) contact (SAC). Conventional field effect transistors (FETs) include a central gate stack over an underlying channel region, and peripheral source and drain regions adjacent the channel. Such self-aligned contacts make electrical connections between the FET and devices such as capacitors or bitlines and are self-aligned by the central gate stack structure.

Conventional salicide formation techniques form salicide over the top of the central gate stack structure and over the top of the source and drain regions. Such structures cannot be used with conventional borderless SACs because the salicide over the gate does not permit sufficient dielectric separation of the SAC and the gate. Thus, conventional structures which utilize both self-aligned contacts and salicide have a high defect rate because the salicide over the gate often forms a short circuit with the self-aligned contact. This short circuit problem essentially prohibits the use of self-aligned contacts over conventional gate structures which include salicide. Therefore, the miniaturization of such salicide devices is limited because the bitline contacts must be formed with conventional lithographic techniques and cannot be self-aligned.

SUMMARY OF THE INVENTION

It is, therefore, an object of the present invention to provide a structure and method for a field effect transistor for dynamic random access memory integrated circuit devices having a gate conductor, salicide regions positioned along sides of the gate conductor, a gate cap positioned above the gate conductor; and at least one self-aligned contact adjacent the gate conductor.

The invention also includes insulating spacers along a lower portion of the gate conductor, wherein the salicide regions are positioned between the insulating spacers and the gate cap along the sides of the gate conductor. Additionally, the invention has a source region and a drain region adjacent a base of the gate conductor, wherein the self-aligned contact forms an electrical connection with the source region or the drain region and there are second salicide regions above the source region and the drain region.

In one embodiment, a method of the invention includes forming an insulator over a gate conductor and a gate cap, etching the insulator to form spacers along a lower portion of sides of the gate conductor, forming a metal over the gate conductor, the gate cap and the spacers and heating the metal to form salicide regions along upper portions of the sides of the gate conductor in direct contact with the metal, removing the metal and leaving the salicide regions, and forming at least one self-aligned contact adjacent the gate conductor.

The etching includes over-etching the insulator sidewall spaces such that the upper portions of the sides of the gate conductor are exposed and come into direct contact with the metal. In addition, salicide regions are formed above the source region and the drain region of the field effect transistor. The self-aligned contact makes an electrical connection to the source region or the drain region of the field effect transistor.

The invention allows salicide devices to be used with self-aligned contacts. By permitting the salicide to be utilized with self-aligned contacts devices, the resistance of such self-aligned contact devices is substantially reduced when compared to conventional structures which either do not include the salicide devices or which do not include the self-aligned contracts.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

This invention enables the formation of a contact which is self-aligned to the gate conductor region and hence may overlap the gate conductor region (a borderless contact), in combination with gate conductor and diffusion regions which contain self-aligned silicide (salicide) conductive regions. The invention enables a compaction in integrated circuit packing density afforded by the borderless diffusion contacts in addition to the device performance advantages associated with the salicide gate and diffusion structures.

Thus, the invention promotes miniaturization of integrated circuits. More specifically, the invention does not form salicides on the top of the gate stack as conventional salicides are formed. Instead, the invention forms salicides on the sides of the gate stack and allows the gate cap to remain on the gate conductor. Therefore, the invention can form self-aligned silicide structures (e.g., salicides) and self-aligned contacts (SAC) in the same integrated circuit device without the electrical shorting which would occur with conventional structures.

Figure 1:
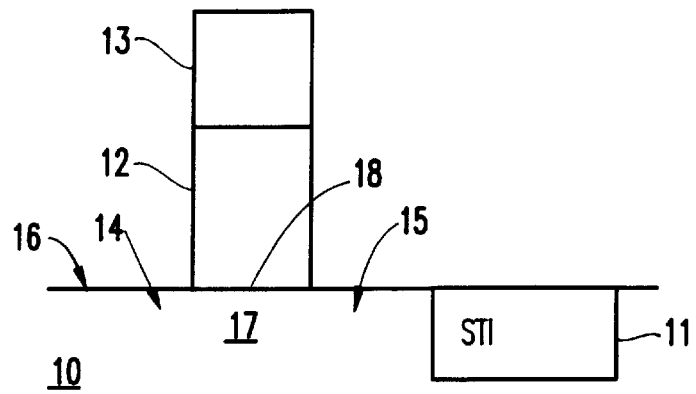
FIG. 1 is a schematic diagram of a partially formed integrated circuit according to the invention.

Referring now to the drawings, and more particularly to FIG. 1, a first embodiment of the invention is illustrated. More specifically, FIG. 1 illustrates a field effect transistor (FET) used with a dynamic random access memory device (DRAM) which includes a substrate 10 (such as a silicon substrate) having a thin gate dielectric such as silicon dioxide 18, an oxide top layer 16, a shallow trench isolation region 11 within the substrate 10, a gate conductor 12 (such as a metal, alloy or doped polysilicon), an insulator gate cap 13 (such as an oxide or nitride), source and drain regions 14, 15 and a channel region 17.

The preferred substrate comprises a P-type single crystal silicon having a (100) crystallographic orientation. The oxide layer 16 preferably comprises silicon oxide formed by a thermal oxidation of the substrate having of preferred thickness 20 Å–400 Å, prior to formation of the gate conductor 12 and cap 13.

The source/drain 14, 15 regions are preferably formed by implanting an atomic species such as arsenic or phosphorus. For example, for an N-type metal oxide semiconductor field effect transistor (MOSFET) a typical implant might consist of phosphorus (P31) or arsenic (As75). The implantation is preferably done through the thin layer of silicon oxide 16 to minimize implant channeling and to protect against contamination by metals and other impurities.

The conductive gate 12 could be formed of a combination of any conductive material, metal or alloy and is preferably formed of a polysilicon layer in contact with the gate dielectric 18.

For example, the doped polysilicon conductive layer 12 could be formed using a low pressure chemical vapor deposition (LPCVD) reactor at a process temperature of between about 550° C. to 650° C. The polysilicon layer 12 could be doped with an N-type impurity by ion implantation using, for example, arsenic ions having an implant dose of between about 1E15 to 20E15 atoms/cm and an ion energy of between about 20 to 80 Kev.

Alternatively, the polysilicon layer 12 can be doped in situ during the polysilicon deposition or an undoped polysilicon layer can be doped by a subsequent overlying layer.

The gate cap 13 can be formed of any appropriate insulating layer, such as the oxides discussed above with respect to the oxide layer 16. Alternatively, the dielectric layer 13 can be formed of silicon nitride, an oxide/nitride/oxide (ONO) film or borophosphosilicate glass (BPSG).

Figure 2:
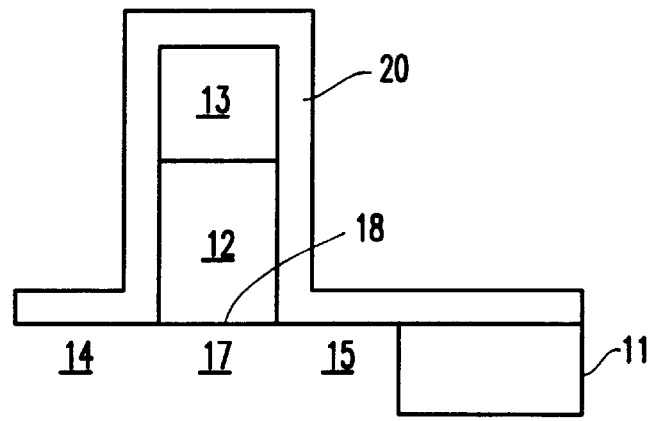
FIG. 2 is a schematic diagram of a partially formed integrated circuit according to the invention.
Figure 3:
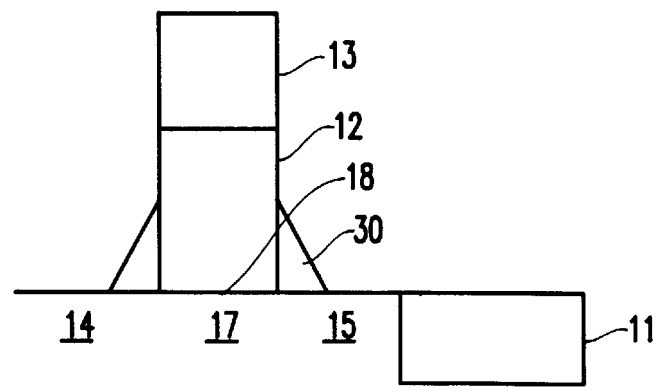
FIG. 3 is a schematic diagram of a partially formed integrated circuit according to the invention.

As shown in FIG. 2, the gate conductor 12 and gate cap 13 (e.g., the "gate stack structure") and the substrate 10 are covered with a conformal coating 20 such as an oxide or nitride, again, using any of the processes described above. The conformal coating 20 is subjected to a selective anisotropic etch (such as a reactive ion etch (RIE)), as shown in FIG. 3. The method and solution used to etch the conformal coating 20 is preferably selective to the gate cap 13, gate 12, oxide 16 materials and isolation oxide 11, such that the gate stack 12, 13 and oxide layer 16 and 11 are not removed by the etching process.

Further, as shown in FIG. 3, the conformal coating 20 is over etched to permit only spacers 30 to remain on the lower portion of the gate conductor 12. The spacers 30 cover approximately 10% to 90% and preferably 30% of the lower portion of the gate conductor 12. The exposed oxide 16 is removed from the wafer surface by etching.

Figure 4:
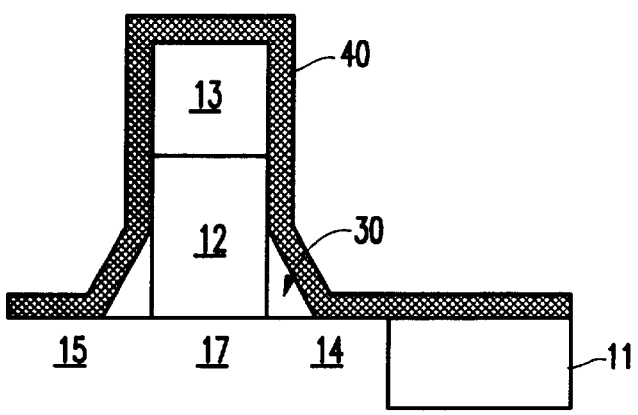
FIG. 4 is a schematic diagram of a partially formed integrated circuit according to the invention.
Figure 5:
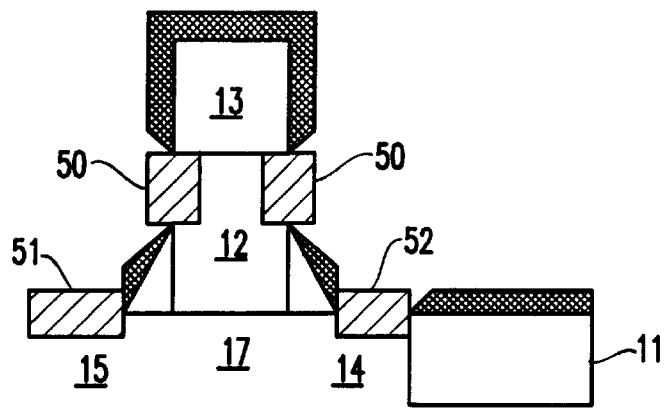
FIG. 5 is a schematic diagram of a partially formed integrated circuit according to the invention.

In FIG. 4, a metal 40 such as titanium, cobalt or tungsten is conformally deposited using methods such as chemical vapor deposition (CVD) or by sputtering. The wafer is annealed, and preferably in a rapid thermal anneal (RTA) process, such that the metal in contact with the exposed sidewall of the gate conductor polysilicon 12, and source and drain silicon regions 14 and 15, reacts to form a silicide only in those regions 12, 14 and 15 and not in other regions of the wafer. The metal 40 which has not reacted to form silicide 50 may then be isotropically etched selectively to the silicide and underlayers including silicon dioxide in the isolation regions 11, and silicon nitride 13 in the gate cap, for example by using an HCl-containing wet etchant. The silicide is not formed in direct proximity to the gate oxide 18, due to the sidewall spacer 30, and hence electrical shorting between the gate conductor 12 and the diffusion regions 14 and 15 is prevented by the sidewall spacer 30.

The silicide will only form where the metal 40 is in direct contact with silicon. Therefore, the silicide is not formed along the cap 13, along the shallow trench isolation region 11 or the portion of the gate conductor 12 which is covered with the spacers 30. In this manner, the silicide formation is self-aligned (e.g., is a salicide) along an upper portion of the sides of the gate 12 and over the source 14 and drain 15 regions.

The amount of salicide 50 formed along the side of the gate conductor 12 is controlled by the amount of over-etching of the sidewall spacer 30. For example, if the spacers cover 30% of the lower portion of the gate conductor 12, the upper 70% of the gate conductor will have salicide formed theron. If salicide is desired along a greater portion of the gate conductor 12 the etching time of the conformal insulator 20 can be extended to remove more of the sidewall spacer 30, thus allowing salicide 50 to form along a greater portion of the gate conductor 12.

Figure 6:
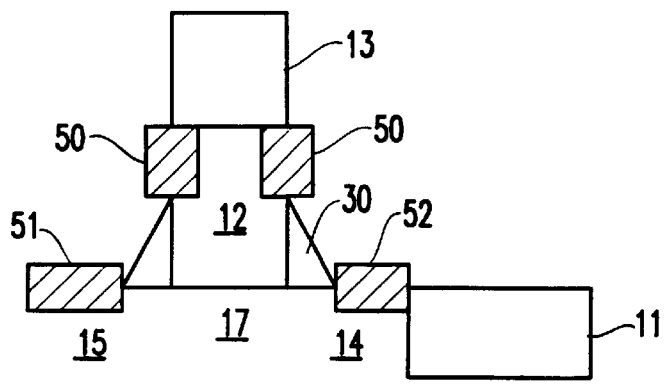
FIG. 6 is a schematic diagram of a partially formed integrated circuit according to the invention.

As shown in FIG. 6, the metal 40 which does not undergo silicide formation is removed with a wet etch such as an HCl-containing isotropic etch. Such an etch is selective to the metal 40 and does not substantially affect the salicide 50 or the insulators 11, 13, 30.

Figure 7:
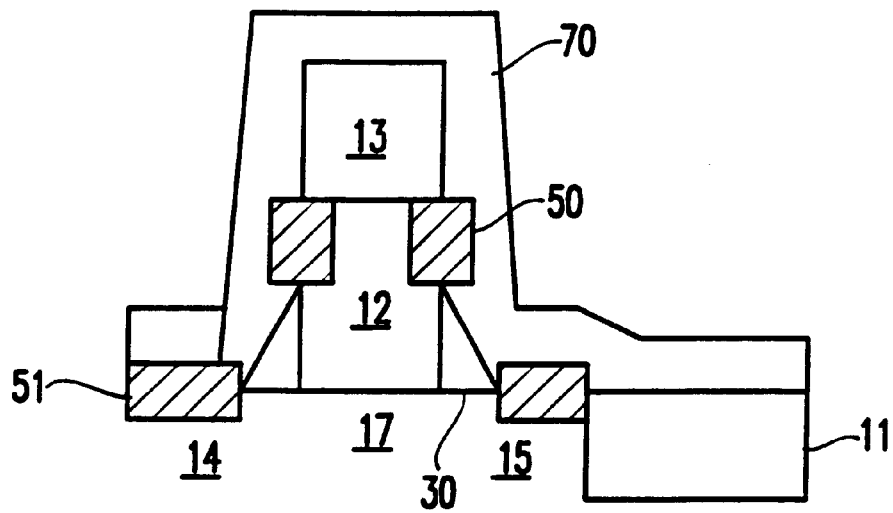
FIG. 7 is a schematic diagram of a partially formed integrated circuit according to the invention.

One of the many features of the invention is that the gate cap 13 remains even after the salicide 50 formation. Therefore, the invention can use the gate cap 13 to safely form a self-aligned diffusion contact (SAC), as shown in FIGS. 7 and 8.

More specifically, an etch stop layer 70, such as a silicon nitride or silicon oxide, is formed over the gate stack structure. Thus, after formation of the gate sidewall and diffusion region salicide, the etch stop spacer 70 can be formed, without overetch, along the sidewall of the gate stack structure 12, 50, 13 and the etch stop layer 70 such as silicon nitride can be deposited over the complete wafer. An interlevel dielectric (ILD) such as boron and phosphorous doped silicon dioxide silicate (BPSG) is deposited and planarized using for example, chemical-mechanical polishing (CMP). Selective dry etching and conventional lithography are used to form borderless self-aligned contacts (SAC) to the diffusion regions. The borderless contact selective dry etching will etch the ILD selectively to the underlayer silicon nitride etchstop 70 and gate cap 13 and may comprise a feedgas such as $C_4F_8$, $C_3F_8$, $CHF_3$, $CH_2F_2$, $CF_4$, CO, $CO_2$, Ar, $N_2$ and/or He. The diffusion contact 80 may be filled with conductive material and planarized to the surface of ILD using conventional processing techniques such as CVD deposition and CMP.

Figure 8:
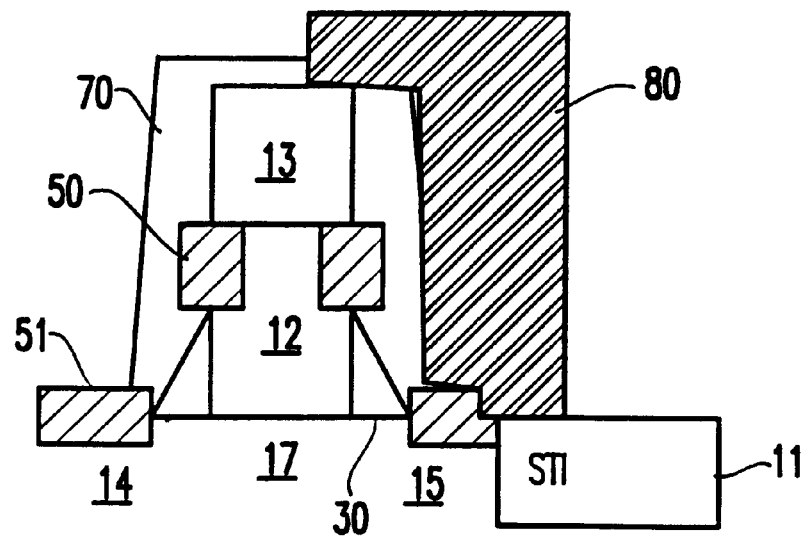
FIG. 8 is a schematic diagram of a partially formed integrated circuit according to the invention.

While one self-aligned contact 80 is illustrated in FIG. 8, additional self-aligned contacts may be formed in the structure. For example, a second self-aligned contact may be formed above the source region 14. The self-aligned contacts commonly form electrical connections to bitlines, capacitors and other similar devices such as the multilevel interconnect wiring. Additional structures including contacts to the gate conductor, wire levels and vias are not shown in the accompanying diagrams, but would be understood by those skilled in the art to be used in the complete integrated circuit.

As shown in FIG. 8, the self-aligned contact 80 often extends to the insulating spacer 70 because of manufacturing variations. Without the gate cap 13, the self-aligned contact 80 has a high chance of shorting against the gate conductor 12. However, with the invention, by forming the salicide devices 50–52 with the gate cap 13 in place, the chance of producing a short circuit is substantially reduced. Therefore, the invention decreases defect rates and enables a compaction of circuit layout, yet still allows the structure to take advantage of the lower resistance and manufacturing efficiency of the salicide structure.

Figure 9:
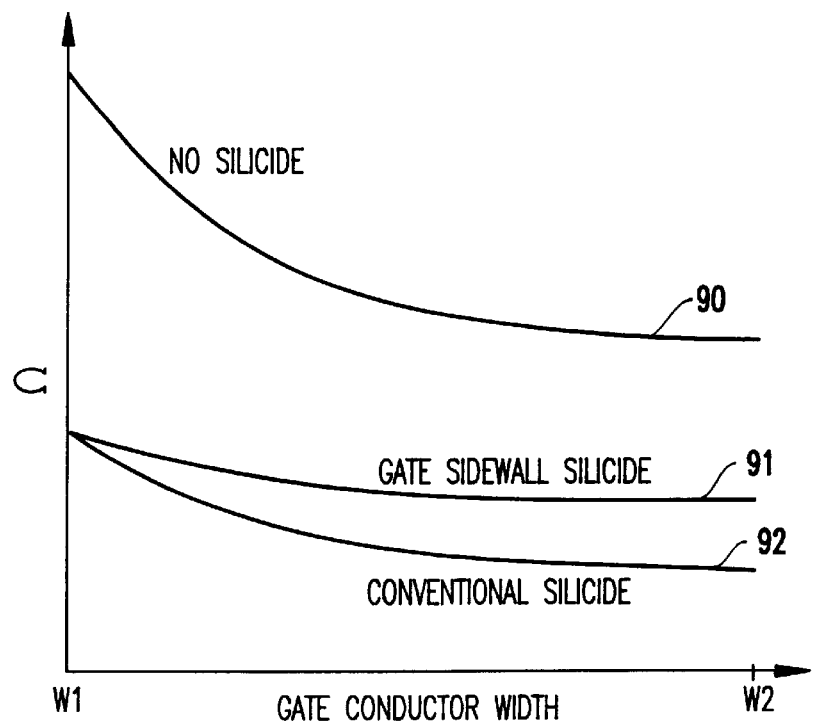
FIG. 9 is a graph illustrating the change in resistance as gate conductor width changes.

FIG. 9 is a graph showing the resistance $\Omega$ of a gate conductor as the width of the gate conductor increases. As shown in FIG. 9, the resistance of the gate conductor generally decreases as gate conductor width increases. Line 90 represents the performance of the device without silicide. Line 92 represents a conventional device having silicide and line 91 represents the inventive device having the gate sidewall silicide 50.

FIG. 9 illustrates that the use of silicide dramatically reduces the resistance of the gate conductor at all useful widths. Further, the inventive gate sidewall silicide 50 has substantially less resistance variation 91 as the gate conductor width varies when compared to the conventional silicide device 92. Therefore, the invention produces a much more stable and reliable integrated circuit device when compared to conventional structures.

Figure 10:
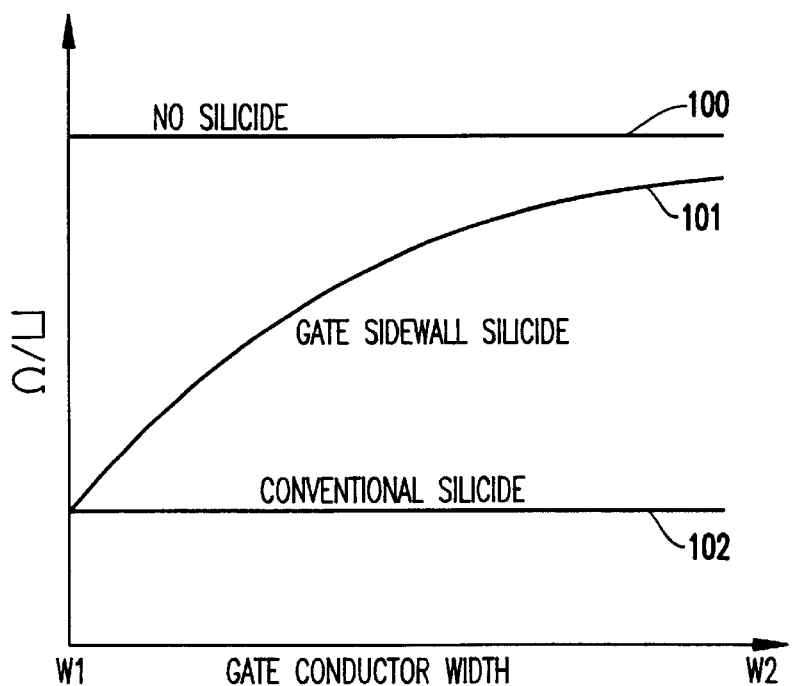
FIG. 10 is a graph illustrating the change in resistance over area as the gate conductor width varies.

FIG. 10 is a graph illustrating the change in resistance $\Omega$ over area $\square$ as the gate conductor width increases. The line 100 illustrates that conventional non-silicide devices do not exhibit a change in the resistant per area as the gate conductor width (e.g., w1 to w2, where w1 is greater than 0) increases. Similarly line 102 illustrates the performance of a conventional salicide gate conductor, which again exhibits no change in resistance per area as the gate conductor width increases.

To the contrary, line 101 illustrates that, with the inventive gate sidewall silicide structure, the resistance per area increases as the gate conductor width increases. Thus, for narrow gate conductor widths, associated with high-performance advanced integrated circuits including merged logic and DRAM, the invention will be superior to conventional non-silicate structures.

Figure 11:
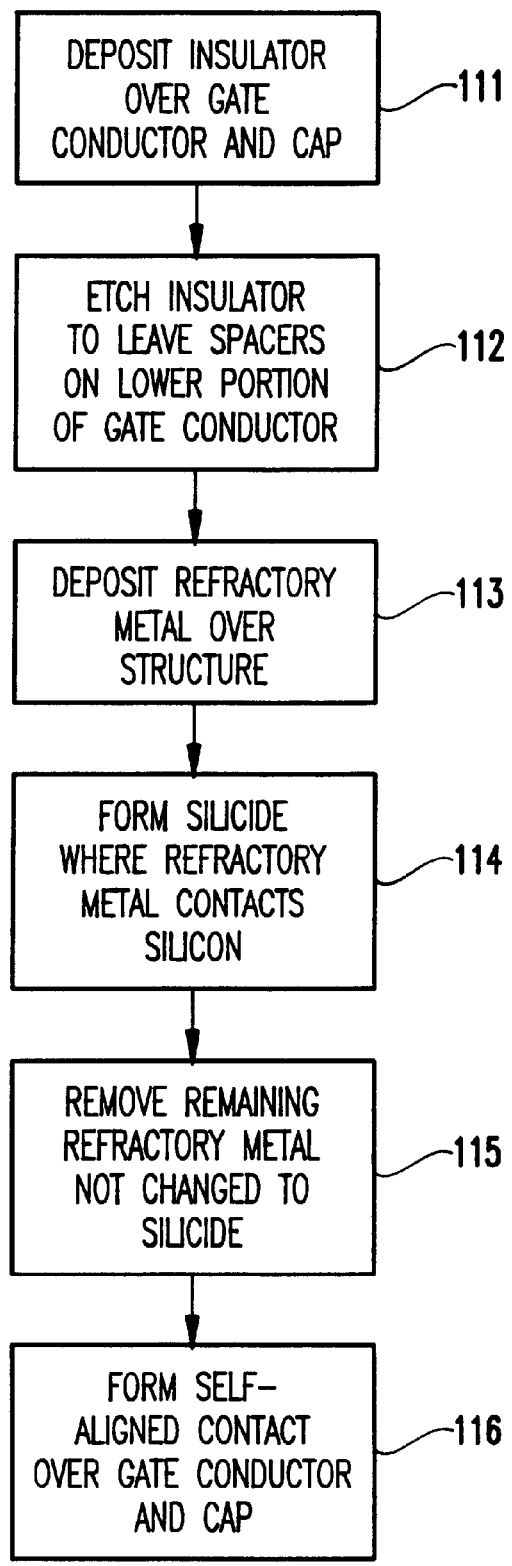
FIG. 11 is a flowchart illustrating a preferred method of the invention.

FIG. 11 is a flowchart illustrating the above-described embodiment of the invention. More specifically, item 111 shows the deposition of the insulator 20 over the gate conductor 12 and cap 13. In item 112 the insulator 20 is etched to form the spacers 30 on the lower portion of the gate conductor 12.

In item 113 the metal 40 is deposited over the structure. In item 114 in the metal 40 reacts with the silicon to form the salicide 50–52. In item 115 the remaining metal 40 which was not converted to silicide 50–52 is removed. In item 116 the self-aligned contact 80 is formed over the integrated circuit structure and is separated from the gate conductor 12 by the gate cap 13.

Therefore, the invention allows salicide devices to be used with self-aligned contacts. By permitting the salicide to be utilized with self-aligned contacts devices, the resistance of such self-aligned contact devices is substantially reduced when compared to conventional structures which either do not include the salicide devices or which do not include the self-aligned contracts.

By permitting the formation of self-aligned diffusion contacts, the invention enables a compaction of the integrated circuit layout by eliminating the requirement to add overlay margin in the layout between the diffusion contact and the gate conductor. Compact integrated circuit layouts may be associated with tight-pitch logic circuits used with memory or logic arrays such as DRAM, SRAM, programmable logic, or merged logic applications.

While the invention has been described in terms of preferred embodiments, those skilled in the art will recognize that the invention can be practiced with modification within the spirit and scope of the appended claims.

What is claimed is:

1. A field effect transistor structure for dynamic random access memory integrated circuit devices comprising:
   a gate conductor having a top surface and sidewalls, said sidewalls having an upper portion and a lower portion;
   salicide regions positioned along said upper portion of said sidewalls and not along said lower portion of said sidewalls of said gate conductor;
   a gate cap positioned over and in contact with said top surface of said gate conductor; and
   at least one self-aligned contact adjacent said gate conductor.

2. The field effect transistor structure in claim 1, further comprising insulating spacers along said lower portion of said sidewalls of said gate conductor, wherein said salicide regions are positioned between said insulating spacers and said gate cap along said upper portion of said sidewalls of said gate conductor.

3. The field effect transistor structure in claim 2, wherein said insulating spacers cover approximately 10% to 90% of said lower portion of said sidewalls.

4. The field effect transistor structure in claim 2, wherein said insulating spacers cover about 30% of said lower portion of said sidewalls.

5. The field effect transistor structure in claim 1, further comprising a source region and a drain region adjacent a base of said gate conductor, wherein said self-aligned contact forms an electrical connection with one of said source region and said drain region.

6. The field effect transistor structure in claim 1, further comprising a source region and a drain region adjacent a base of said gate conductor, and second salicide regions above said source region and said drain region.

7. The field effect transistor structure in claim 1, wherein said salicide regions exist only along said upper portion of said sidewalls of said gate conductor.

8. An integrated circuit device comprising:
   a conductor having a top surface and sidewalls, said sidewalls having an upper portion and a lower portion;
   salicide regions positioned along said upper portion of said sidewalls of said conductor;
   a cap positioned over and in contact with said top surface of said conductor; and
   at least one self-aligned contact adjacent said conductor.

9. The integrated circuit device in claim 8, further comprising insulating spacers along said lower portion of said sidewalls of said conductor, wherein said salicide regions are positioned between said insulating spacers and said cap along said upper portion of said sidewalls of said conductor.

10. The integrated circuit device in claim 9, wherein said insulating spacers; cover approximately 10% to 90% of said lower portion of said sidewalls.

11. The integrated circuit device in claim 9, wherein said insulating spacers cover about 30% of said lower portion of said sidewalls.

12. The integrated circuit device in claim 8, wherein said salicide regions exist only along said upper portion of said sidewalls of the conductor.

13. The integrated circuit device in claim 8, wherein said conductor comprises a gate conductor, said cap comprises a gate cap.

14. The integrated circuit device in claim 13, further comprising a source region and a drain region adjacent a base of said conductor, wherein said self-aligned contact forms an electrical connection with one of said source region and said drain region.

15. The integrated circuit device in claim 13, further comprising a source region and a drain region adjacent a base of said conductor, and second salicide regions above said source and said drain region.

16. A field effect transistor structure comprising:
   a gate conductor having a top surface and sidewalls, said sidewalls having an upper portion and a lower portion;
   salicide regions positioned only along said upper portion of said sidewalls of said gate conductor;
   a gate cap positioned over and in contact with said top surface of said gate conductor; and
   at least one self-aligned contact adjacent said gate conductor.

17. The field effect transistor structure in claim 16, further comprising insulating spacers along said lower portion of said sidewalls of said gate conductor, wherein said salicide regions are positioned between said insulating spacers and said gate cap along said upper portion of said sidewalls of said gate conductor.

18. The field effect transistor structure in claim 17, wherein said insulating spacers cover approximately 10% to 90% of said lower portion of said sidewalls.

19. The field effect transistor structure in claim 16, further comprising a source region and a drain region adjacent a base of said gate conductor, wherein said self-aligned contact forms an electrical connection with one of said source region and said drain region.

20. The field effect transistor structure in claim 16, further comprising a source region and a drain region adjacent a base of said gate conductor, and second salicide regions above said source region and said drain region.

* * * * *